United States Patent [19]

Kuntner et al.

[11] 4,243,894
[45] Jan. 6, 1981

[54] SOLID STATE MOTOR CONTROL UNIVERSAL ASSEMBLY MEANS AND METHOD

[75] Inventors: Richard J. Kuntner, Milwaukee; James C. Van der Meer, Brookfield, both of Wis.

[73] Assignee: Eaton Corporation, Cleveland, Ohio

[21] Appl. No.: 947,739

[22] Filed: Oct. 2, 1978

[51] Int. Cl.³ ................... H02B 13/00; H05K 7/02
[52] U.S. Cl. ........................ 307/147; 174/16 HS; 361/388; 357/81
[58] Field of Search ............... 361/388; 357/75, 79, 357/81; 174/16 B, 16 HS; 307/112, 147

[56] References Cited

U.S. PATENT DOCUMENTS

| 3,356,902 | 12/1967 | Blaikie | 361/388 |
|---|---|---|---|
| 3,471,757 | 10/1969 | Sias | 174/16 HS |
| 3,523,215 | 8/1970 | Steinmetz | 361/388 |
| 3,536,960 | 10/1970 | Otteson | 361/388 |
| 3,551,758 | 12/1970 | Ferree | 357/75 |
| 3,609,511 | 9/1971 | Risberg | 321/45 R |
| 4,015,173 | 3/1977 | Nitsche | 361/388 |

Primary Examiner—Richard A. Wintercorn
Assistant Examiner—S. D. Schreyer
Attorney, Agent, or Firm—Hugh R. Rather; William A. Autio

[57] ABSTRACT

A solid state motor control or power control universal assembly means and method whereby common parts are used to provide two basic semiconductor power pole versions, namely, a two-terminal power pole having two semiconductors in reverse-parallel connection between the terminals and a three-terminal power pole having two semiconductors in series connections between two terminals and a third terminal therebetween. These two power pole versions are the requiste subassemblies that may then be connected in various combinations to provide the numerous different types of motor control and power control systems commonly used. Each power pole consists of two semiconductors (either thyristors, diodes, or one of each) or the like, a combination of short and/or long bus bars (two short and one long bus bar for the 3-terminal power pole; two long bus bars for the 2-terminal power pole), one long and two short heat sinks, two clamps for clamping the power semiconductors between the bus bars and heat sinks, a support for mounting each power pole on a panel, control circuit mounted on the support, and lugs for connecting such systems to a power supply and motor or other load device. A plurality of these power poles may be mounted on a panel and connected as individual 2 and 3-terminal devices. Or a plurality of these power poles mounted on a panel also include bus connectors for connecting them into various power control configurations.

12 Claims, 36 Drawing Figures

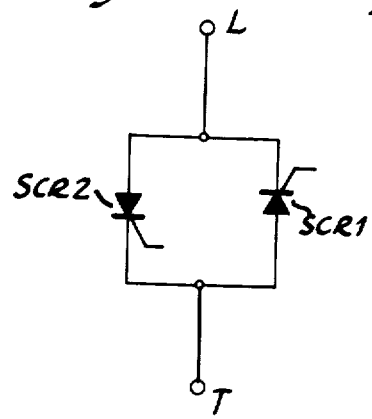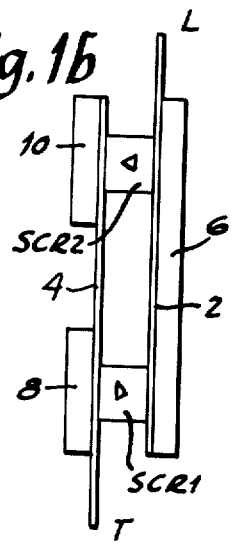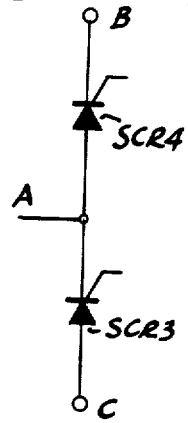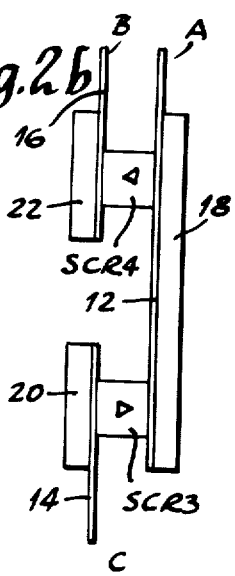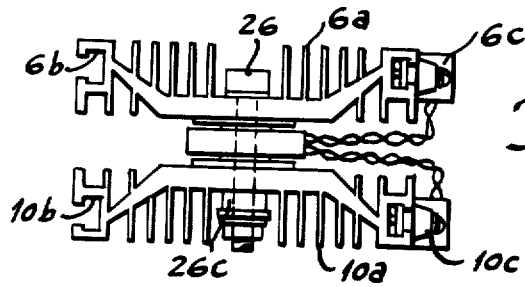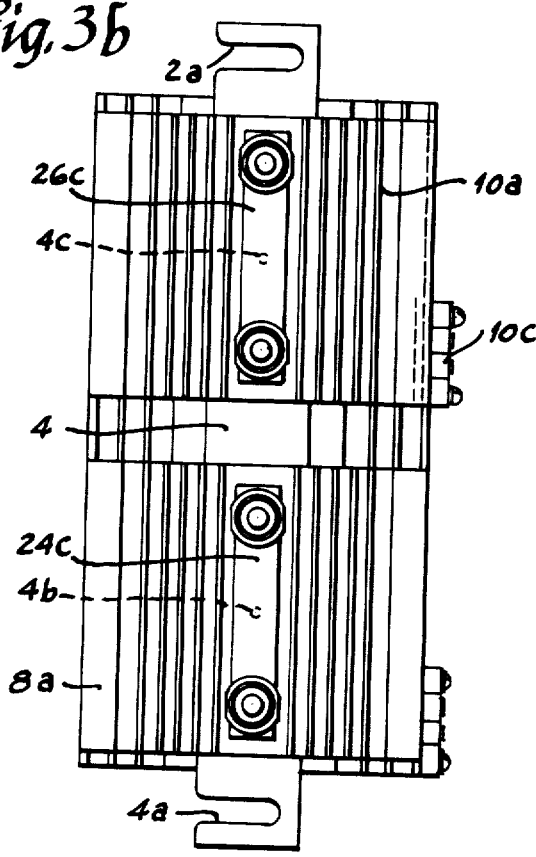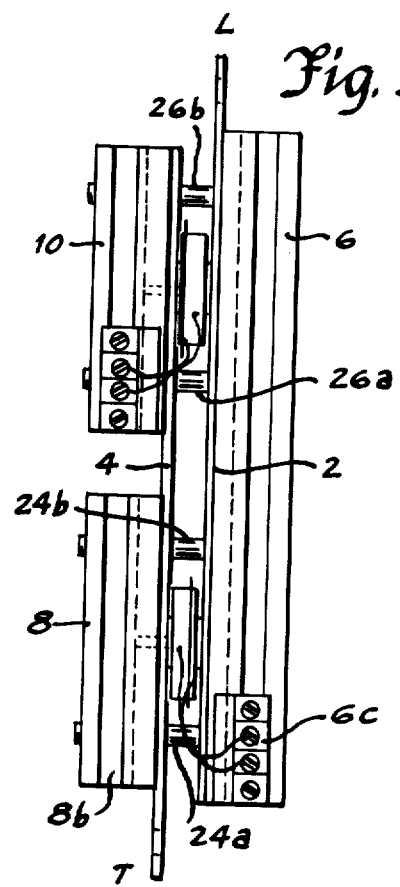

3φ A.C. MOTOR CONTROL

3φ A.C. REV.

3φ ½ WAVE D.C. WITH REV.

3 φ A.C. MOTOR CONTROL

1 φ FULL WAVE

3 φ FULL WAVE 2 QUADRANT

3 φ FULL WAVE 4 QUADRANT

3 φ FULL WAVE HYBRID

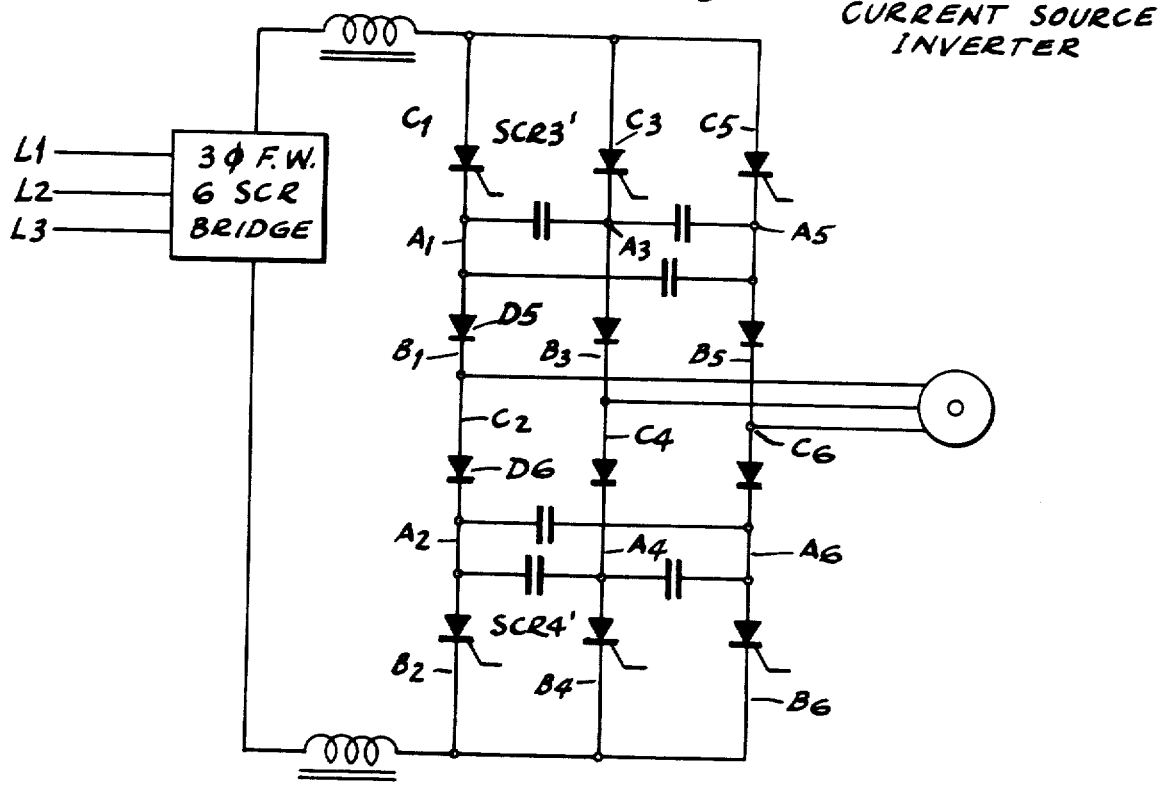
Fig. 19 CURRENT SOURCE INVERTER
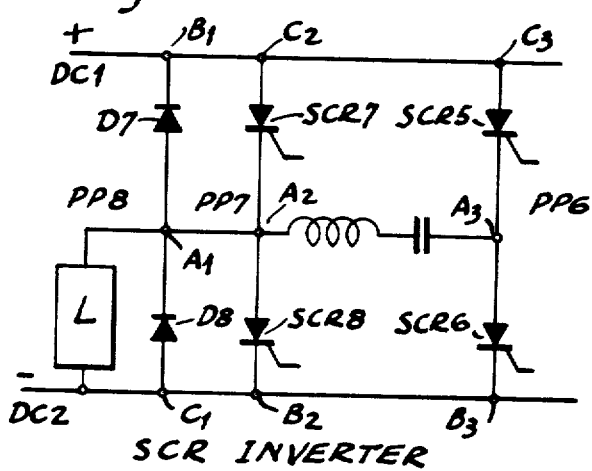
Fig. 20 SCR INVERTER
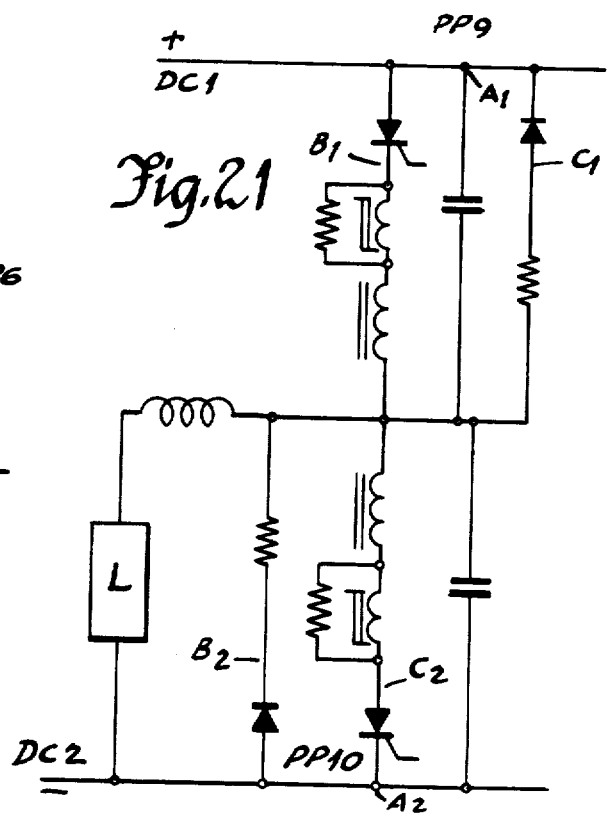
Fig. 21

SOLID STATE MOTOR CONTROL UNIVERSAL ASSEMBLY MEANS AND METHOD

BACKGROUND OF THE INVENTION

Solid state motor control and power control systems have been known heretofore. While such systems have employed various mounting structures for the various semiconductors in order to electrically connect the same as well as to provide for flow of coolant medium thereabout, such structures have generally been rather complex in nature and limited to use in one type of control system rather than having any universality of application, thus requiring a large number of different parts if such structures are to serve even a limited range of control systems in customary use. For example, one of these known structures is a heat sink module wherein a single semiconductor, a pair of heat sinks and a support are clamped together and are connected to a bus bar and mounted on a wall or a panel such as shown in C. S. Otteson et al U.S. Pat. No. 3,536,960, dated Oct. 27, 1970. Another of these known structures relates to a semiconductor stack wherein a plurality of semiconductor devices, electrodes and heat sinks are stacked within a rectangular frame and held in compression by spring washers and with a number of insulator elements interspersed in suitable places to electrically isolate the semiconductor devices as required such as shown in J. J. Steinmetz et al U.S. Pat. No. 3,523,215, dated Aug. 4, 1970. While these prior known semiconductor device mountings have been useful for their intended purposes, this invention relates to improvements thereover.

SUMMARY OF THE INVENTION

An object of the invention is to provide an improved semiconductor mounting and connecting means.

A more specific object of the invention is to provide an improved solid state power pole universal assembly means and method.

Another specific object of the invention is to provide a set of common parts from which a 2-terminal power pole subassembly having two semiconductors in reverse-parallel connection or a 3-terminal power pole subassembly having two semiconductors in series connection may be assembled with minimum variation in the parts.

Another specific object of the invention is to provide a two-semiconductor power pole subassembly which with minimum modification can have universal application in that it can be used in selected numbers to provide any of the various motor control and power control circuits in general use.

Another specific object of the invention is to provide a universal power pole assembly method.

Another specific object of the invention is to provide improved power pole mounting and bus bar connecting arrangements for connecting a plurality of power poles of the aforementioned type into various power control configurations.

Other objects and advantages of the invention will hereinafter appear.

BRIEF DESCRIPTION OF THE DRAWINGS

FIG. 1a is a circuit diagram of a first version of a solid state power pole of the two-terminal type having two thyristors in reverse-parallel connection;

FIG. 1b is a schematic illustration of the power pole of FIG. 1a showing how the two thyristors are actually mounted between bus bars and heat sinks;

FIG. 2a is a circuit diagram of a second version of a solid state power pole of the three-terminal type having two thyristors in series connection;

FIG. 2b is a schematic illustration of the power pole of FIG. 2a showing how the two thyristors are actually mounted between the bus bars and heat sinks;

FIGS. 3a–c are front, side and end views, respectively, of the first version of power pole showing in detail how the two thyristors are clamped between the bus bars and heat sinks to provide good electrical and thermal connection therebetween;

FIGS. 15–22 are circuit diagrams showing eight different motor and power control systems that can be assembled using different numbers of the second version power pole;

FIG. 24b is a graph showing operating characteristics of the universal gate control circuit of FIG. 24a.

DESCRIPTION OF THE PREFERRED EMBODIMENT

Figure 4A:
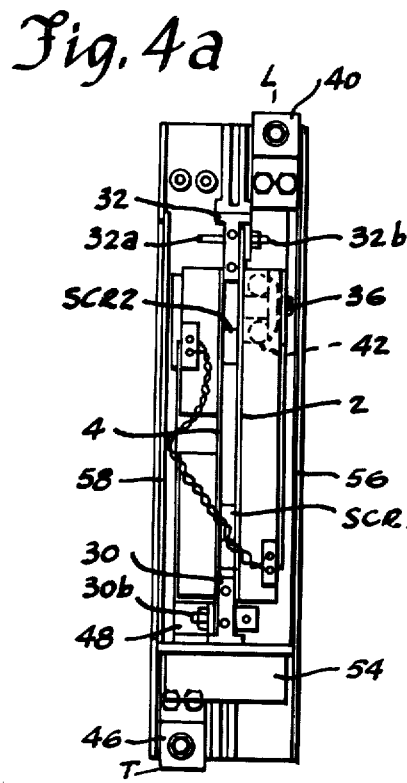
FIGS. 4a–c are front, side and end views, respectively, of a two-terminal power pole assembly using the first version of power pole of FIGS. 3a–c and constructed by the universal assembly means and method.

Referring to FIGS. 1a–b and 2a–b, there are shown in diagram and schematic form the two basic power pole sub-units that may be used in selected numbers in assembling a large variety of motor control and power control systems hereinafter described in connection with FIGS. 9–23.

The first version of static power pole shown in FIG. 1a is a 2-terminal sub-unit having two semiconductors such as thyristors SCR1 and SCR2 in reverse-parallel connection between a terminal L and a terminal T. These semiconductors may be thyristors, power diodes, or one of each, or power transistors, or the like. As shown schematically in FIG. 1b, this first version power pole is assembled by placing semiconductors of the pressure-mounted disc type such as thyristors SCR1 and SCR2 in reverse-parallel relation and spaced apart between two like bus bars 2 and 4 with the terminal ends L and T of these bus bars extending in opposite directions for supporting and electrically connecting this sub-unit as hereinafter described. In addition, a long heat sink 6 is placed against long bus bar 2 opposite the two thyristors, and a pair of like, short heat sinks 8 and 10 are placed against long bus bar 4 opposite the two thyristors, respectively. A pair of clamps are then used to clamp the thyristors, bus bars and heat sinks together as hereinafter described in connection with FIGS. 3a–c.

In FIG. 1b, long bus bars 2 and 4 are alike and short heat sinks 8 and 10 are alike. This multiple use of like parts reduces the number of different parts that must be stocked for assembling power poles of this first version.

The second version of static power pole shown in FIG. 2a is a 3-terminal sub-unit having two semiconductors (in this case thyristors SCR3 and SCR4) in series connection between terminals C and B and with terminal A between the semiconductors. These semiconductors likewise may be thyristors, power diodes or one of each, or power transistors, or the like. As shown schematically in FIG. 2b, this second version power pole is assembled by placing similar flat pack semiconductors of the pressure-mounted disc type such as thyristors SCR3 and SCR4 in reverse relation and spaced apart between a long bus bar 12 and a pair of short bus bars 14 and 16, respectively. The terminal ends A and B of long bus bar 12 and short bus bar 16 extend in one direction and the terminal end C of short bus bar 14 extends in the other direction for supporting and electrically connecting this sub-unit as hereinafter described. In addition, a long heat sink 18 is placed against long bus bar 12 opposite the two thyristors and a pair of like, short heat sinks 20 and 22 are placed against short bus bars 14 and 16 opposite the two thyristors, respectively. A pair of semiconductor clamps are then used to clamp the thyristors, bus bars and heat sinks together as hereinafter described in connection with FIGS. 6a–c.

In FIG. 2b, long bus bar 12, long heat sink 18 and short heat sinks 20 and 22 are identical to the corresponding elements in FIG. 1b. Also, in FIG. 2b, short bus bars 14 and 16 are alike but oriented differently so that their terminals extend in opposite directions. This multiple use of like parts requires stocking of only two different lengths of bus bars, short and long, and only two different lengths of heat sinks, short and long, to produce the two-terminal and three-terminal power poles shown in FIGS. 1b and 2b.

Figure 23:
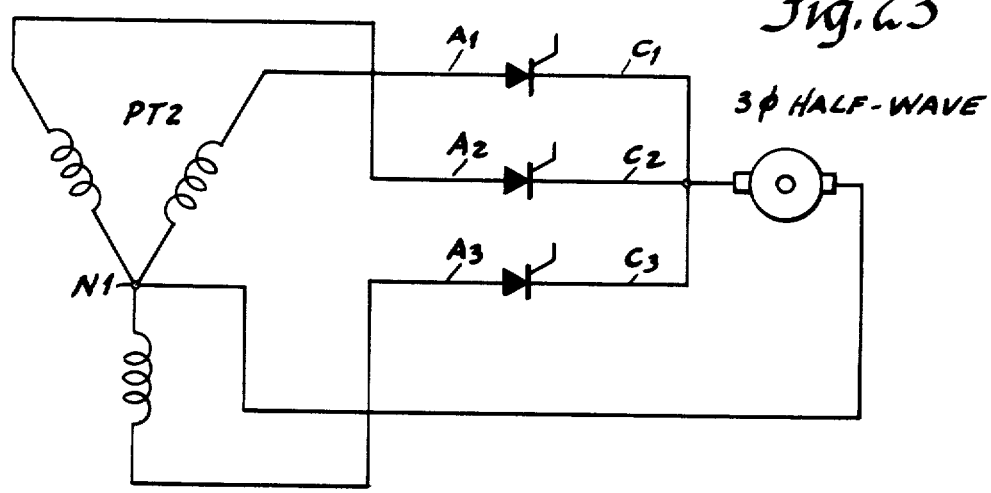
FIG. 23 is a circuit diagram showing a motor control system that can be assembled using three units of a modification of the second version power pole, each such unit having a single-thyristor two-terminal power pole.

A modified power pole required in some motor control systems such as that shown in FIG. 23, having only a single thyristor, may be attained in FIG. 2b by omitting thyristor SCR4, bus bar 16 and heat sink 22 and the corresponding semiconductor clamp. This modification will provide a two-terminal power pole having a single thyristor between terminal A and terminal C. It is also necessary in this modification to turn thyristor SCR3 around so that terminal A will be on its anode side.

Referring to FIGS. 3a–c, there is shown the actual structure of the two-terminal power pole sub-unit shown schematically in FIG. 1b. Reference characters like those in FIG. 1b are used in FIGS. 3a–c for corresponding parts. As shown therein, long bus bars 2 and 4 are alike and each consists of an elongated, flat metal ribbon having two pairs of holes through which the arms 24a–b and 26a–b of the generally U-shaped clamps 24 and 26 extend. These bus bars also have two pairs of screw holes, not shown, adjacent the respective clamp holes, through which counter sunk screws extend for pre-assembling the bus bars to the heat sinks. These heat sinks include a long heat sink 6 attached to bus bar 2 and two short heat sinks 8 and 10 attached to bus bar 4. As shown in FIG. 3b, these bus bars are also provided with terminal end portions having lateral slots 2a and 4a extending thereinto from the lower edge through which threaded studs extend for supporting and electrically connecting the power pole as shown in FIG. 4b. These bus bars are further provided with a pair of small holes each, holes 4b and 4c being shown in broken lines in FIG. 3b, through which short spring pins attached to the heat sinks extend for positioning the thyristors.

The long and short heat sinks are alike in cross-section as shown in FIG. 3c and are provided with a plurality of fins 6a, 8a, 10a for heat conduction into the surrounding air which is preferably caused to flow for enhanced heat dissipation. These heat sinks are also provided each with a pair of channels 6b, 8b, 10b along their opposite longitudinal edges for mounting terminal blocks 6c and 10c to which the gate-cathode conductors, if required, of the respective thyristors are connected. These heat sinks are also provided with pairs of holes in registration with the aforementioned pairs of holes in the bus bars through which the pairs of arms of the semiconductor clamps extend. A pressure bar, 24c, 26c shown in FIGS. 3b–c, is then placed over the ends of each clamp followed by force indicator Belleville washers and nuts turned tight thereon to clamp the parts together. Clamps of this type also have a short pin secured to the inside of the bight thereof which enters the outer end of one of the holes in the heat sink to the inner end of which the aforementioned thyristor positioning pin is secured, such holes extending all the way through the heat sink. This short pin on the bight of the clamp positions the clamp with respect to the heat sink.

Figure 4B:
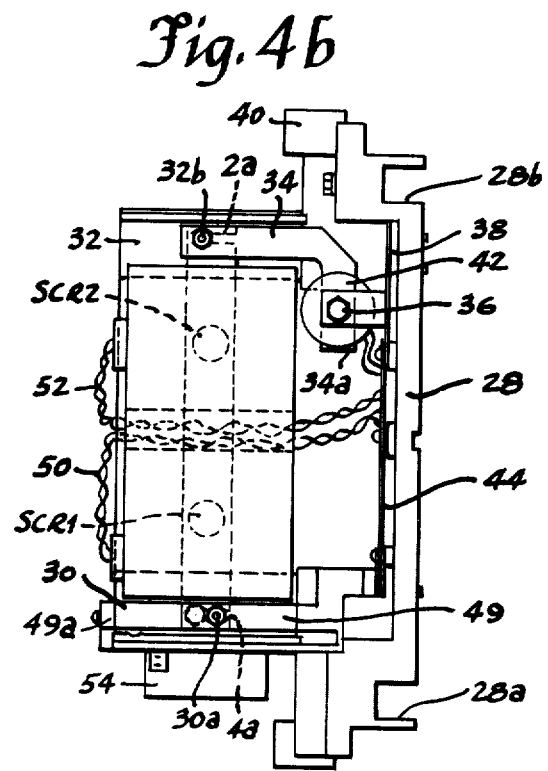
Figure 4C:
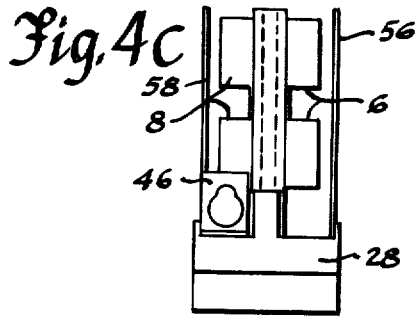
Figure 5:
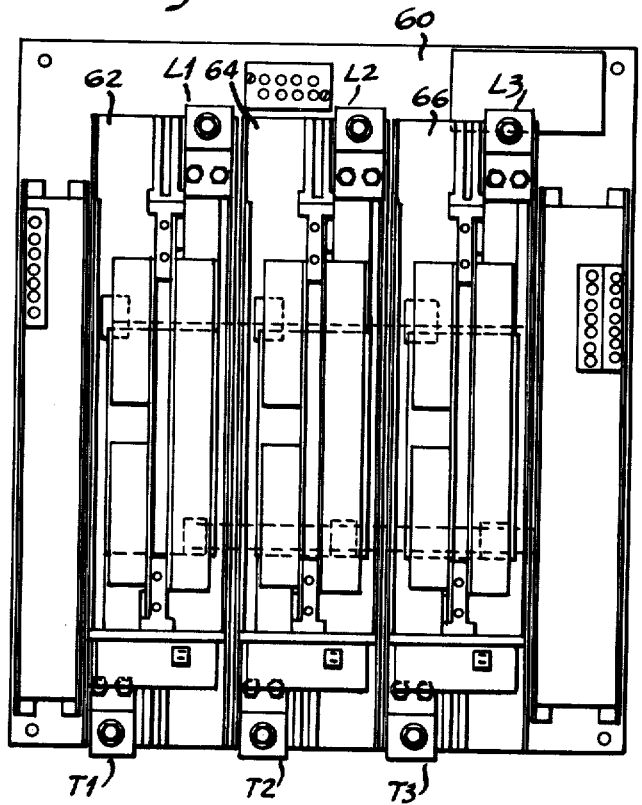
FIG. 5 is a front view of a three-phase solid state reduced voltage motor starter having three of the FIG. 4a–c two-terminal power poles mounted on a supporting panel.

This power pole sub-unit shown in FIGS. 3a–c is mounted and connected in a power pole assembly as shown in FIGS. 4a–c which then may be mounted on a supporting panel along with additional power pole assemblies as shown in FIG. 5 to provide a motor control system.

This power pole assembly is provided with supporting means comprising an insulating molded base 28 and a pair of insulating molded posts 30 and 32 attached thereto as shown in FIG. 4b for supporting the power pole sub-unit shown in FIGS. 3a–c. These posts are similar and have a pair of tapped inserts on each end whereby they are attached by threaded studs to the base. By thus providing a pair of tapped inserts at each end, identical posts can be used by turning the other post around so that both are positioned properly for mounting the power pole sub-unit therebetween as shown in FIG. 4a. For supporting and electrically connecting the power pole sub-unit, each post 30 and 32 is provided with a pair of threaded studs 30a–b, 32a–b having one end molded into the post and extending laterally in opposite directions. This allows the bus bar connector slots 2a and 4a to be dropped onto two of these studs as shown in FIG. 4b. A generally L-shaped bus connector 34 shown in FIG. 4b is also placed on stud 32b and a nut turned on this stud to connect bus bar 2 to the bus connector. The angular portion 34a of bus connector 34 is connected through a bolt 36 surrounded by a copper brushing to a line terminal 38 having a terminal lug 40 attached thereto and mounted at the end of the base. A current sensing coil 42 surrounds the copper bushing on bolt 36 to provide a signal proportional to the load current, such coil being shown schematically in FIG. 24a. The two conductors of coil 42 are connected to the circuit on printed circuit board 44 which is mounted at the central portion of base 28 as shown in FIG. 4b.

Bus bar 4 is connected to a load terminal lug 46 mounted at the other end of the base as shown in FIGS. 4a-c. For this purpose, a load terminal 48 is connected by a nut to stud 30b of post 30 and terminal lug 46 is connected to this load terminal and mounted on the other end of the base. Stud 30a of this support post is connected by a connector 49 to a ground terminal on printed circuit board 44, and an upstanding part 49a of this connector supports a fan hereinafter described.

Pairs of wires 50 and 52 connect terminal blocks 6c and 10c on the heat sinks to printed circuit board 44 so that the gate-cathode junctions of the two controlled semiconductors are connected to the control circuit on the PC board.

A fan assembly 54 is mounted at one end by a suitable bracket to connector part 49a so that it directs air flow about the heat sinks to cool the thyristors. Such bracket may conveniently be connected by a screw to the laterally bent end of the aforementioned part 49a of ground connector 49.

The power pole subassembly shown in FIGS. 4a-c may also be provided with a pair of insulating barriers 56 and 58 comprising flat plates best shown in FIG. 4c mounted to the base on opposite sides thereof and slightly spaced from the heat sinks. These side barriers insulate side-by-side mounted power pole subassemblies from one another and guide the air flow coming from the fan to the heat sinks and semiconductors mounted therebetween.

To provide a three-phase semiconductor circuit, three power pole subassemblies of the reverse-parallel connected type hereinbefore described may be mounted on a supporting panel as shown in FIG. 5. As shown therein, support panel 60 has three power pole subassemblies 62, 64 and 66 mounted side-by-side thereon so that their terminal lugs L1, L2 and L3, corresponding to terminal L in FIG. 1b, are at the top and their terminal lugs T1, T2 and T3, corresponding to terminal T in FIG. 1b, are at the bottom.

Figure 11:
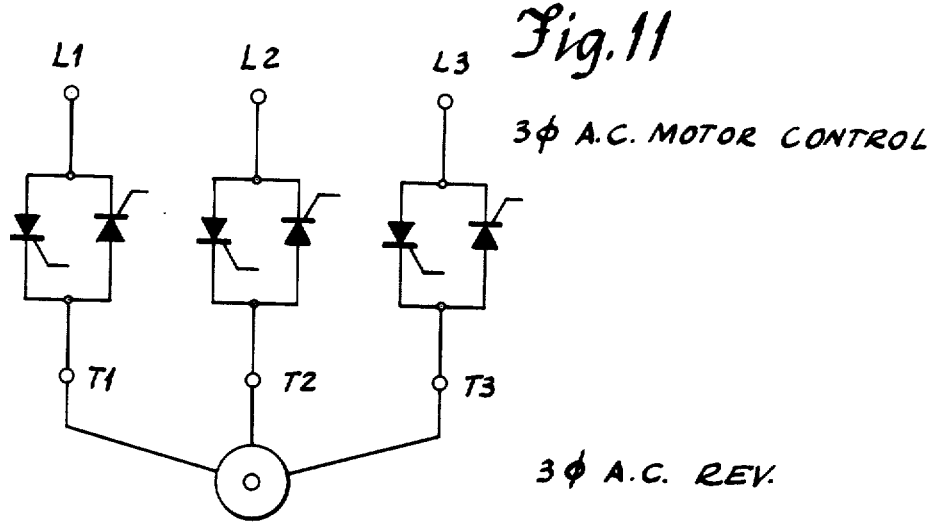

This three power pole assembly shown in FIG. 5 is adapted to be connected in a motor control circuit such as the 3-phase A.C. circuit shown in FIG. 11.

Figure 9:
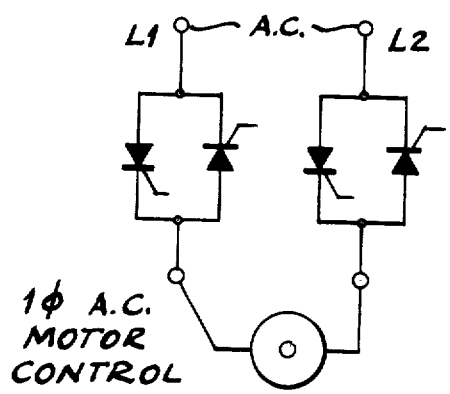
FIGS. 9–14 are circuit diagrams showing six different motor control systems that can be assembled using different numbers of the first version power pole.

FIG. 9 shows a single-phase A.C. motor control system having power poles in both sides of the line to enable complete disconnection of the motor from the line. Only two power pole subassemblies are required for this circuit.

Figure 10:
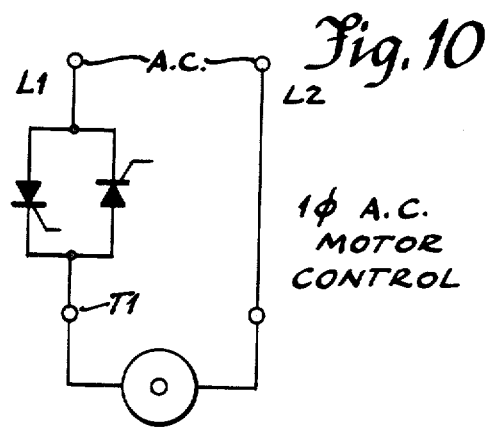

The circuit shown in FIG. 10 is a single-phase A.C. motor control system having a power pole only in one side of the line. While it will control the motor in the manner of the FIG. 9 circuit, one line will always remain connected to the motor.

Figure 12:
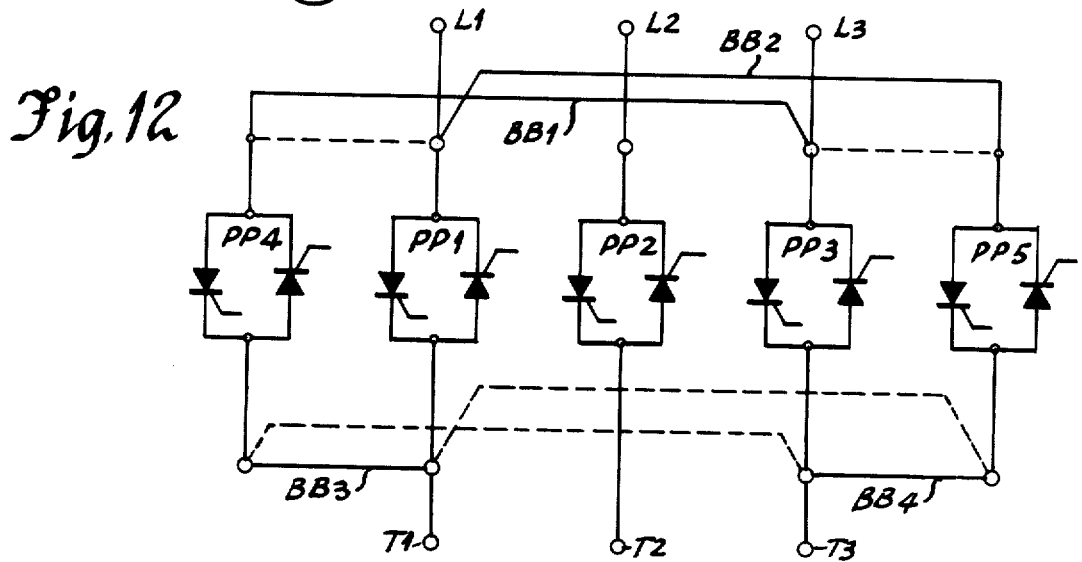

FIG. 12 shows a 3-phase A.C. reversing motor control system that can readily be assembled by using a plurality of power pole subassemblies hereinbefore described in connection with FIGS. 4a-c. As is apparent, this control systems requires the three center power pole subassemblies PP1, PP2 and PP3 for unidirectional operation of the motor and further requires the two outside power pole subassemblies PP4 and PP5 for reversing the motor. The motor will reverse when two of the three phases are reversed. For this purpose, it will be apparent that for forward operation, power poles PP1, PP2 and PP3 connect power line terminal L1 to load terminal T1, L2 to T2 and L3 to T3. For reverse operation, power poles PP4 and PP5 are operated along with power pole PP2. Power pole PP4 connects power line terminal L3 to load terminal T1 and power pole PP5 connects power line terminal L1 to load terminal T3 as shown in solid lines. Alternatively, the reversing connections can be made as shown in broken lines. Thus, two phases have been reversed to reverse the phase rotation and to cause the motor to run in the reverse direction. These five power poles may be mounted on a panel as shown in FIG. 25.

Figure 25:
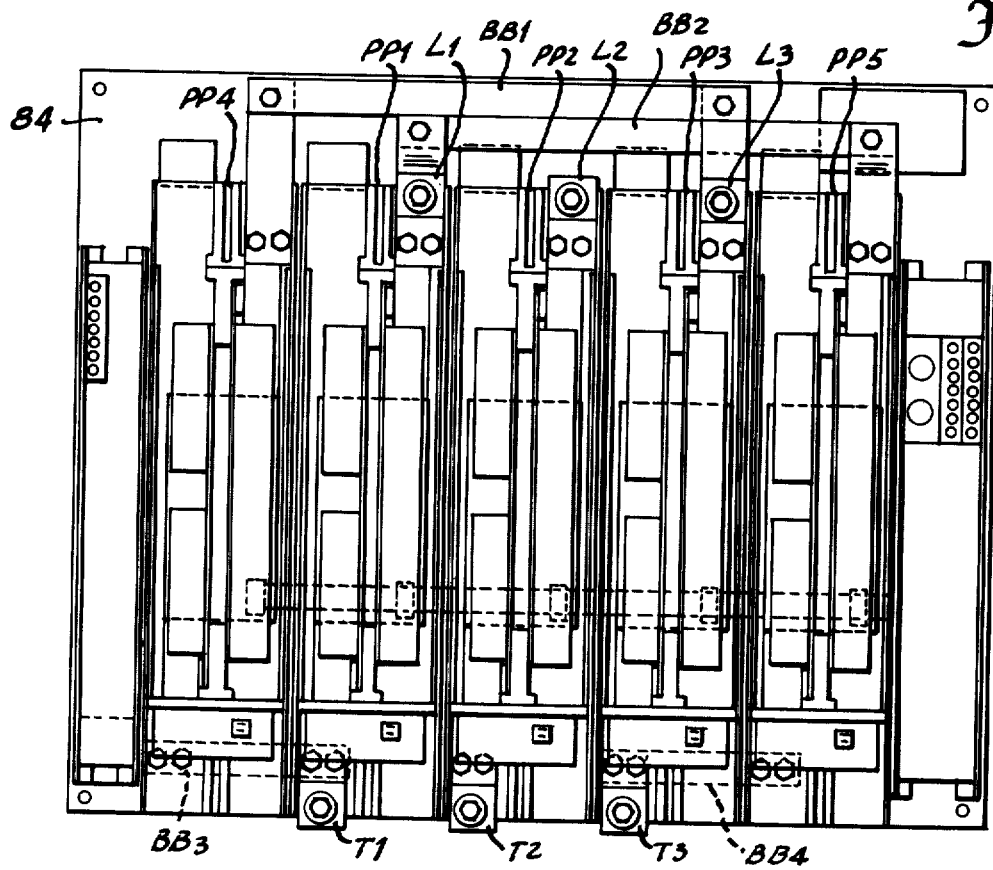
FIG. 25 is a front view of a three-phase solid state reduced voltage reversing motor starter having five of the FIG. 4a–c two-terminal power poles mounted on a supporting panel with the two outside power poles being used for reversing two phases of the three-phase system as shown in FIG. 12.

FIG. 25 also shows how the reversing connections BB1 and BB2 to power poles PP4 and PP5 shown in solid lines in FIG. 12 can actually be made. The upper, line terminals of power poles PP3 and PP4 are connected together by a bus bar BB1 and a pair of connectors at each end thereof. The upper, line terminals of power poles PP1 and PP5 are connected together by a bus bar BB2. The connectors at the opposite ends of bus bar BB1 are preferably straight whereas the connectors at the opposite ends of bus bar BB2 have two bends to offset the upper ends thereof toward the mounting panel thereby to prevent any short circuit between these bus bars. Bus bars BB3 and BB4 are straight connectors between the output terminals of power poles PP4 and PP1 as well as PP3 and PP5, respectively, which run below the bases of the power poles in the lateral channels 28a of FIG. 4b.

If the broken line connections in FIG. 12 were used instead, four bus bars would also be required. The upper two bus bars could run below the bases of the power poles in the lateral channels similar to BB3 and BB4 while the lower broken line connections would require bus bars similar to BB1 and BB2 and the associated connectors.

Figure 13:
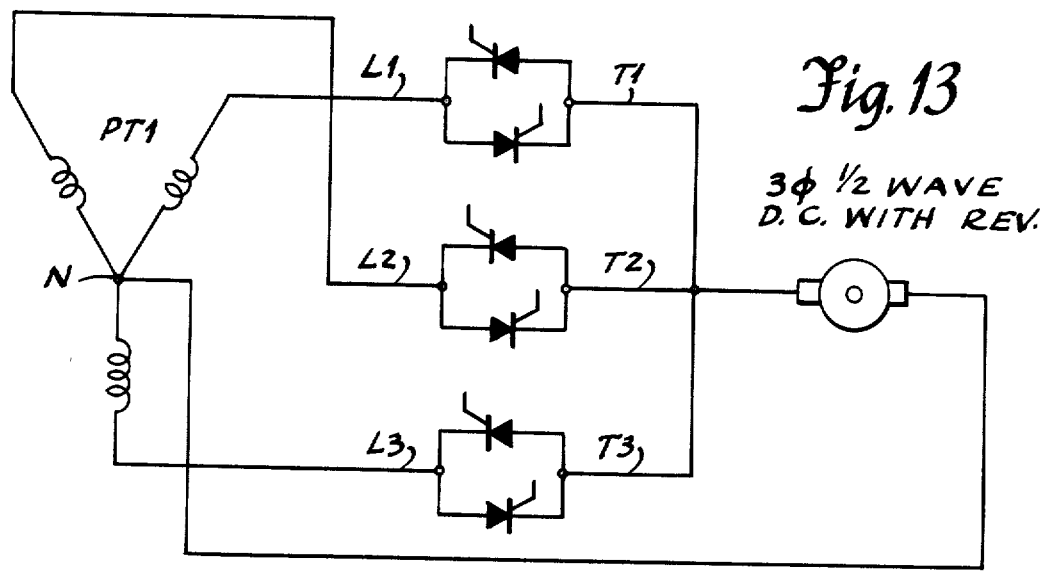

A further system that may be attained using the reverse-parallel thyristors power pole subassemblies of FIGS. 4a-c is the 3-phase half-wave D.C. reversing motor control system of FIG. 13. In this system, the three terminals of a three-phase power supply transformer PT1 are connected to the line terminals L1, L2 and L3 of three power pole sub-assemblies having thyristors in reverse-parallel connection. The load terminals T1, T2 and T3 of the three power pole sub-assemblies are connected together and to one side of the armature winding of a D.C. motor, the other side of which is connected to the neutral N of the three-phase power transformer.

These load terminals T1, T2 and T3 may be connected together by a laterally running bus bar below the bases of the power pole subassemblies as hereinafter described in connection with FIGS. 7a-c.

Figure 14:
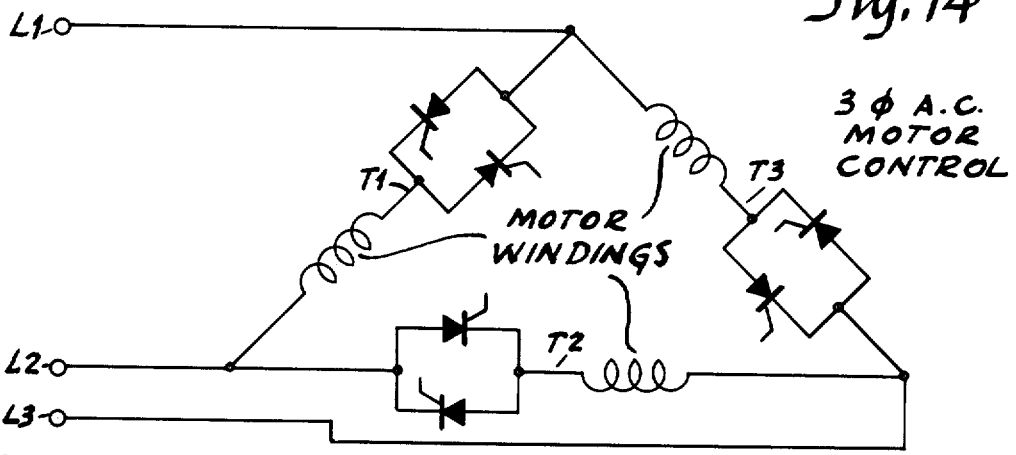

FIG. 14 shows a still further motor control system that may be connected using three power pole subassemblies of the aforedescribed reverse-parallel thyristor type. In this system, which is a 3-phase A.C. motor ntrol system, the three power poles are connected in ries with the respective three windings of a delta-connected, 6-wire, 3-phase motor to reduce the currents in e thyristors.

Figure 6C:
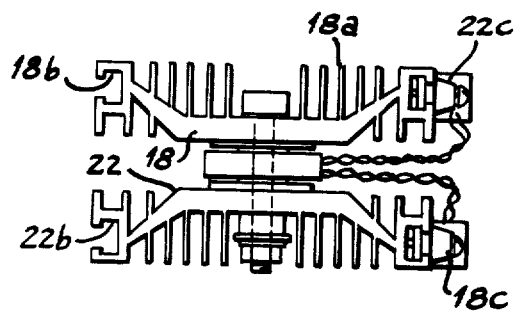
FIGS. 6a–c are front, side and end views, respectively, of the second version of power pole showing in detail how the two thyristors are clamped between the bus bars and heat sinks to provide good electrical and thermal connection therebetween.
Figure 6B:
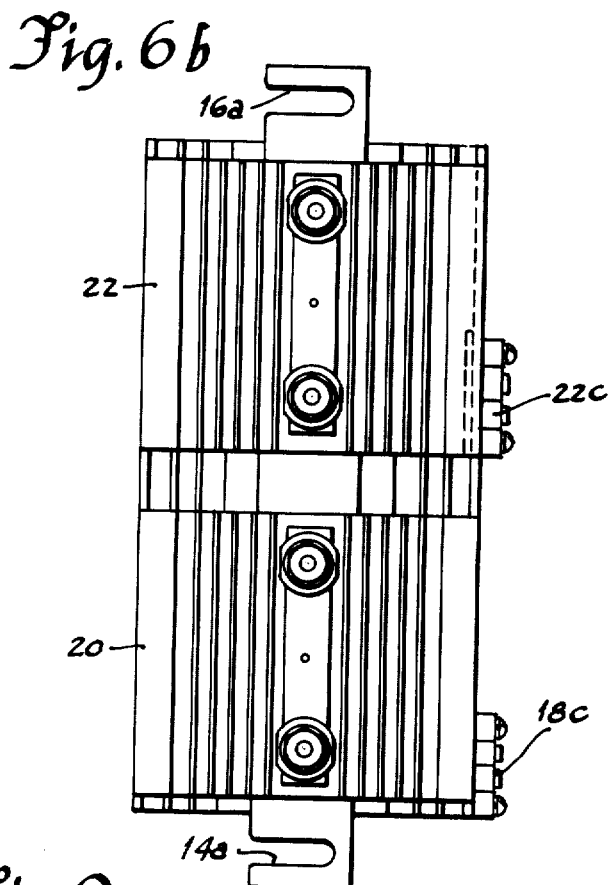
Figure 6A:
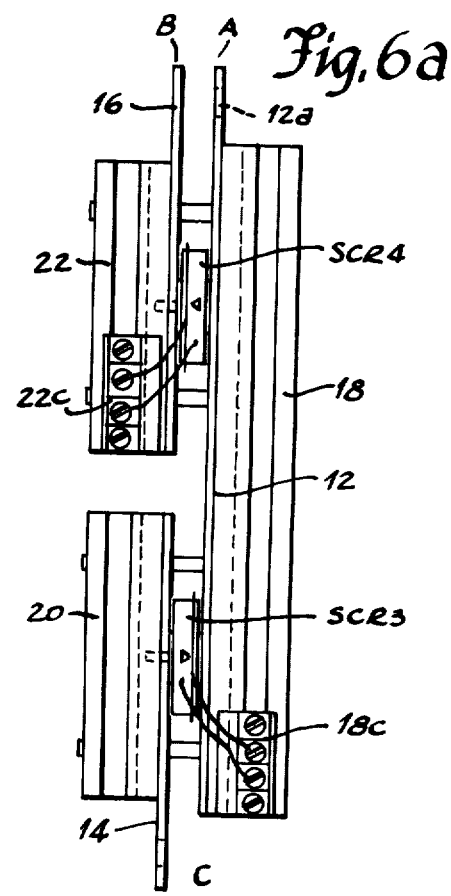

Referring to FIGS. 6a–c, there is shown the actual ucture of the three-terminal power pole sub-unit own schematically in FIG. 2b. Reference characters e those in FIG. 1b are used in FIG. 6a–c for corre- onding parts. As shown therein, long bus bar 12 is milar to the long bus bars in FIGS. 3a–c and is provided with a similar slot 12a at its connector end. Also, is long bus is similarly attached to long heat sink 18 d is provided with similar holes for the arms of the yristor clamps and the locating pins. Short bus bars 14 d 16 are alike and their terminal portions that have e slots 14a and 16a as shown in FIG. 6b extend in pposite directions for supporting and connecting the yristors as hereinafter described. Also, these two ort bus bars together have the aforementioned holes f a long bus bar for attaching the short bus bars to heat nks 20 and 22 through which the arms of the clamps nd locating pins extend. Heat sinks 18, 20 and 22 are ke those in FIGS. 3a–c. Also, the heat sink fins, channels and terminal blocks are similar to those hereinbe- ore described. It is apparent that the power pole subassembly in FIGS. 6a–c is similar to that in FIG. 3a–c xcept that two short bus bars are used in place of one f the long bus bars. Thyristor SCR3 and SCR4 gate- athode leads are connected to terminal blocks 18c and 2c.

Figure 7A:
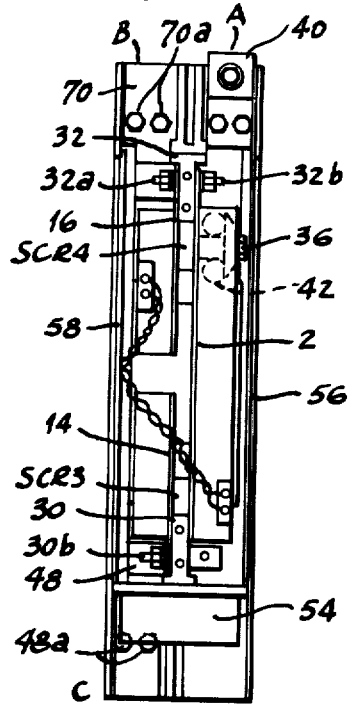
FIGS. 7a–c are front, side and end views, respectively, of a three-terminal power pole assembly using the second version of power pole of FIGS. 6a–c and constructed by the universal assembly means and method.
Figure 7B:
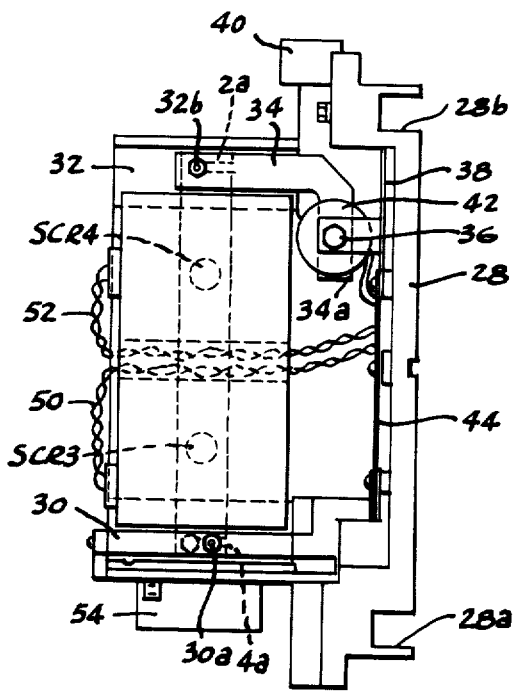
Figure 7C:
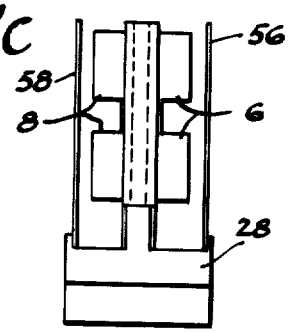
Figure 8:
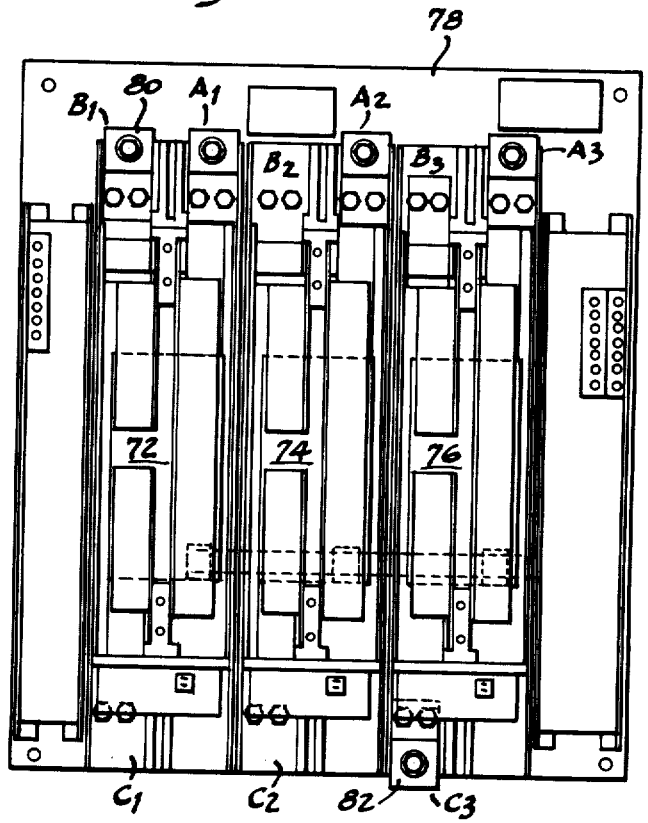
FIG. 8 is a front view of a solid state D.C. bridge having three of the FIG. 7a–c three-terminal power poles mounted on a supporting panel.

This power pole sub-unit shown in FIGS. 6a–c is nounted and connected in a power pole assembly as hown in FIG. 7a–c which then may be mounted on a upporting panel along with additional power pole as- emblies as shown in FIG. 8 to provide a motor control system.

This power pole assembly shown in FIGS. 7a–c is similar to that shown in FIGS. 4a–c and hereinbefore described except for some differences which now will be described. Since this is a 3-terminal power pole, it has an additional terminal 70 for terminal B. For convenience, these terminals will be designated A, B and C as will hereinafter appear in connection with FIGS. 15–23. In FIGS. 7a–c, reference characters similar to those in FIGS. 4a–c will be used for like elements. Terminal 70 is connected to bus bar 16 by a nut threaded on stud 32a. This terminal 70 is also secured to the base by a pair of screws 70a extending therethrough and threaded into tapped inserts near the end of base 28 as shown in FIG. 7a. At the other end of this base, terminal 48 which is connected to bus bar 14 by a nut on stud 30b is also connected to the base by a pair of screws 48a turned into tapped inserts molded into the base. These two pairs of inserts extend all the way through the base and are tapped from both ends half-way so that screws 70a and 48a can be turned in from the top and a similar pair of screws can be turned in from the bottom for connecting a plurality of B and/or C terminals. For this purpose, base 28 is provided with lateral channels 28a and 28b beneath the opposite ends thereof as shown in FIG. 7b to provide access to the aforementioned pairs of inserts from below. These lateral channels are provided for receiving bus connectors for connecting terminals C1, C2 and C3 and/or terminals B1, B2 and B3 of a plurality of power pole assemblies 72, 74 and 76 together when they are mounted side-by-side on a panel 78 as shown in FIG. 8. With this arrangement of bus connectors, only one connector lug 80 and one connec- tor lug 82 are required to connect the B terminals and C terminals respectively across the load device as shown in FIG. 8 and FIGS. 15–18. In FIGS. 7a–b, the threaded inserts in base 28 into which the lug 40 mounting screws are turned do not extend all the way through the base.

As will be apparent, one of the aforementioned bus connectors connects the anodes of corresponding semiconductors together whereas the other bus connector connects the cathodes of the remaining corresponding semiconductors together. These connections are shown diagrammatically in FIGS. 15–18.

Figure 15:
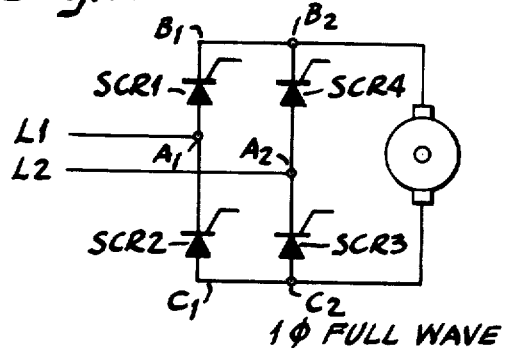

FIG. 15 shows a single-phase full-wave controlled rectifier system for a D.C. motor. For this system, only two power pole assemblies of the 3-terminal type shown in FIGS. 7a–c are required to be mounted side-by-side on a panel. The cathodes of the two upper thyristors are connected by a bus connector together at terminals B1 and B2 and then by the lug to one side of the D.C. motor. The anodes of the two lower thyristors are similarly connected together at terminals C1 and C2 and to the other side of the D.C. motor armature winding. Any of the SCR pairs (SCR1, SCR2), (SCR2, SCR3), (SCR3, SCR4) and (SCR1, SCR4) could also be diodes.

Figure 16:
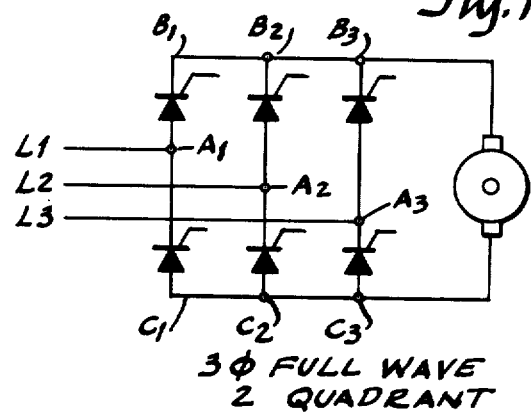

FIG. 16 shows a 3-phase full-wave D.C. motor control system for 2-quadrant operation. As shown therein, the three power lines L1, L2, L3 of a 3-phase source are connected through three of the 3-terminal power pole circuits to the armature winding of a D.C. motor. The three power lines L1, L2 and L3 are connected to the anodes of corresponding thyristors of the three power poles at terminals A1, A2 and A3 whose cathodes are connected together by the aforementioned connector bus at terminals B1, B2 and B3 and then to one side of the motor armature winding. The other side of the motor armature winding is connected to another connector bus that is connected in common at terminals C1, C2 and C3 to the anodes of the remaining three thyristors of the three power poles whose cathodes are connected at terminals A1, A2 and A3 to the respective power lines. In this way, three-phase full-wave current is applied to the D.C. motor and this current is varied by gate control of the thyristors to vary the speed of the motor, the motor field winding being normally supplied from another D.C. circuit.

Figure 17:
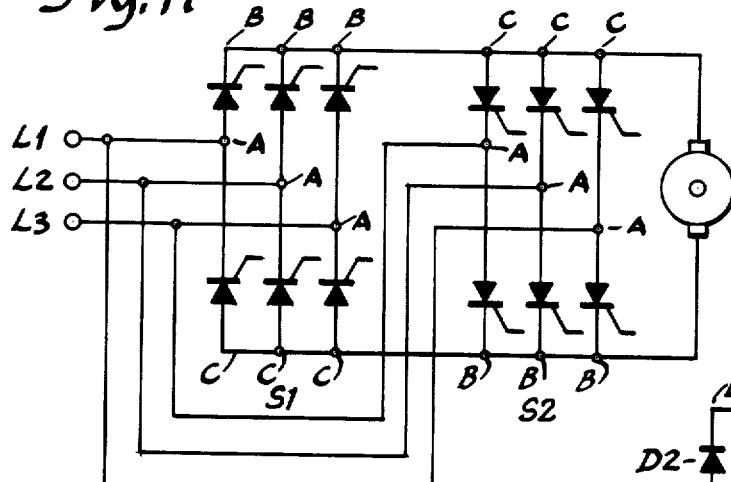

FIG. 17 shows a 3-phase full-wave D.C. motor control system for 4-quadrant operation, that is, 2-quadrants for forward operation and 2 quadrants for reverse operation. As will be apparent, this system has one set S1 of three 3-terminal power poles for applying controlled current to the D.C. motor in one direction for forward operation and another similar set S2 of three 3-terminal power poles for applying controlled current to the D.C. motor in the other, or reverse, direction.

Figure 18:
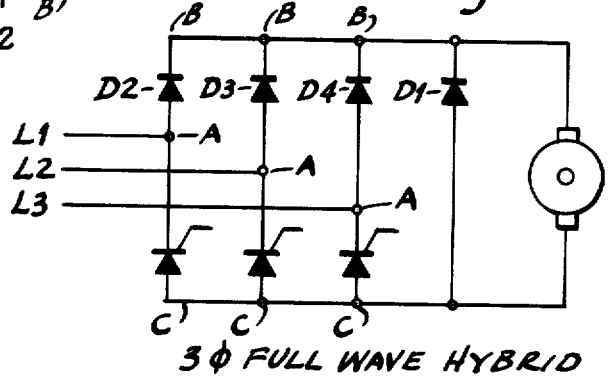

FIG. 18 shows a 3-phase full-wave D.C. motor control system like FIG. 16 but with the addition of a unidirectional diode D1 connected across the armature winding in a direction to conduct current in response to the inductive current of the armature winding. This system also differs from FIG. 16 in that first controlled thyristors of the latter have been replaced by unidirectional diodes D2, D3 and D4. In this manner, only three controlled thyristors need be fired to control motor speed. These motor control systems are known in the art so that their operation will not be described in more detail.

FIG. 19 shows a system known as a "current source" inverter wherein the speed of a 3-phase A.C. motor is controlled from a 3-phase power supply line L1, L2 and L3. The 3-phase power is converted to adjustable voltage D.C. in a 3-phase full-wave 6-SCR bridge. The D.C. is then converted to adjustable frequency A.C. in an inverter having six 3-terminal power poles. Each of these power poles is like the power pole assembly shown in FIG. 2a–b, 6a–c and 7a–c except that in the upper three power poles a diode D5 has been substituted in place of SCR4 of FIG. 2b. And in the lower three power poles, SCR3 has been replaced by a diode D6. However, it is apparent from the illustration in FIG. 19 that these 3-terminal power pole assemblies have variable application with minimum substitution of common parts. In this system, the terminal reference characters of FIG. 2a–b with suffix numbers added have been applied to the six power poles to show the application thereof.

FIG. 20 shows an SCR inverter supplied from a D.C. line DC1–DC2 for applying adjustable frequency AC to a load L. As will be apparent, this system uses a first 3-terminal power pole PP6 having SCR5 and SCR6, a second similar 3-terminal power pole PP7 having SCR7 and SCR8, and a third 3-terminal power pole PP8 having two diodes D7 and D8. On the other hand, SCR7 and diode D7 could be placed in one power pole and SCR8 and diode D8 in another power pole according to which circuit connections are more convenient to make.

FIG. 21 shows a chopper circuit supplied from a D.C. line DC1–DC2 for applying controllable pulses to a load L. This circuits uses two 3-terminal power poles PP9 and PP10, each having an SCR and a diode. In this circuit, the terminal reference characters C, A and B of FIG. 2a–b with suffix numbers added have been applied to the two power poles PP9 and PP10 to indicate how they are applicable in this circuit. The other elements of this chopper circuit are known in the art and need not be described in detail.

Figure 22:
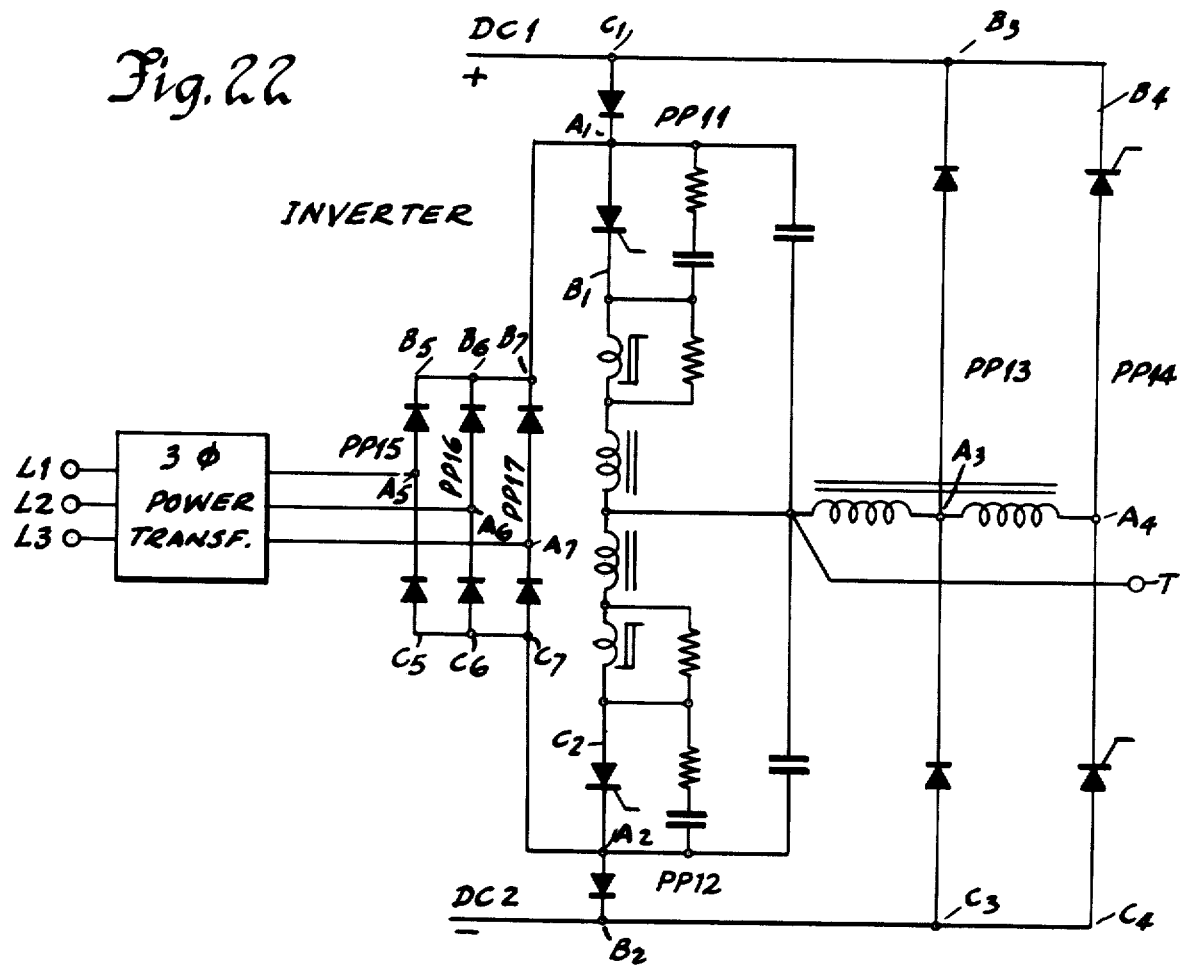

FIG. 22 shows an inverter system such as a square-wave welder control system generally similar to that disclosed in R. L. Risberg U.S. Pat. No. 3,609,511, dated Sept. 28, 1971. This system uses seven 3-terminal power poles PP11 through PP17. In power pole PP11, SCR3 of FIG. 2a–b has been replaced by a diode. In power pole PP12, SCR4 of FIG. 2a–b has been replaced by a diode. In power poles PP13, PP15, PP16 and PP17 both SCR's of FIG. 2a–b have been replaced by diodes. Only power pole PP14 has two SCR's as in FIG. 2a–b. The connections of the power pole terminals of FIG. 2a–b are apparent from an inspection of FIG. 22.

FIG. 23 shows a 3-phase half-wave D.C. motor control system. As hereinbefore mentioned, this system uses modifications of the 3-terminal power pole of FIG. 7a–c. This modification to a single thyristor power pole is attained by omitting SCR4 and its bus bar and heat sink and clamp in FIG. 7a–c, and turning SCR3 around so that terminal A1 will be on the anode side of SCR3. Three such modified power poles are then mounted side-by-side on a panel, their terminals A1, A2 and A3 connected to the three phases of a power transformer PT2 and their terminals C1, C2 and C3 connected together by a bus and then to one side of the D.C. motor. The other side of the D.C. motor is connected to neutral N1 of the power transformer.

The large number of different control circuits or systems hereinbefore briefly described show the practically unlimited application of the universal power pole design and construction disclosed herein.

Figure 24A:
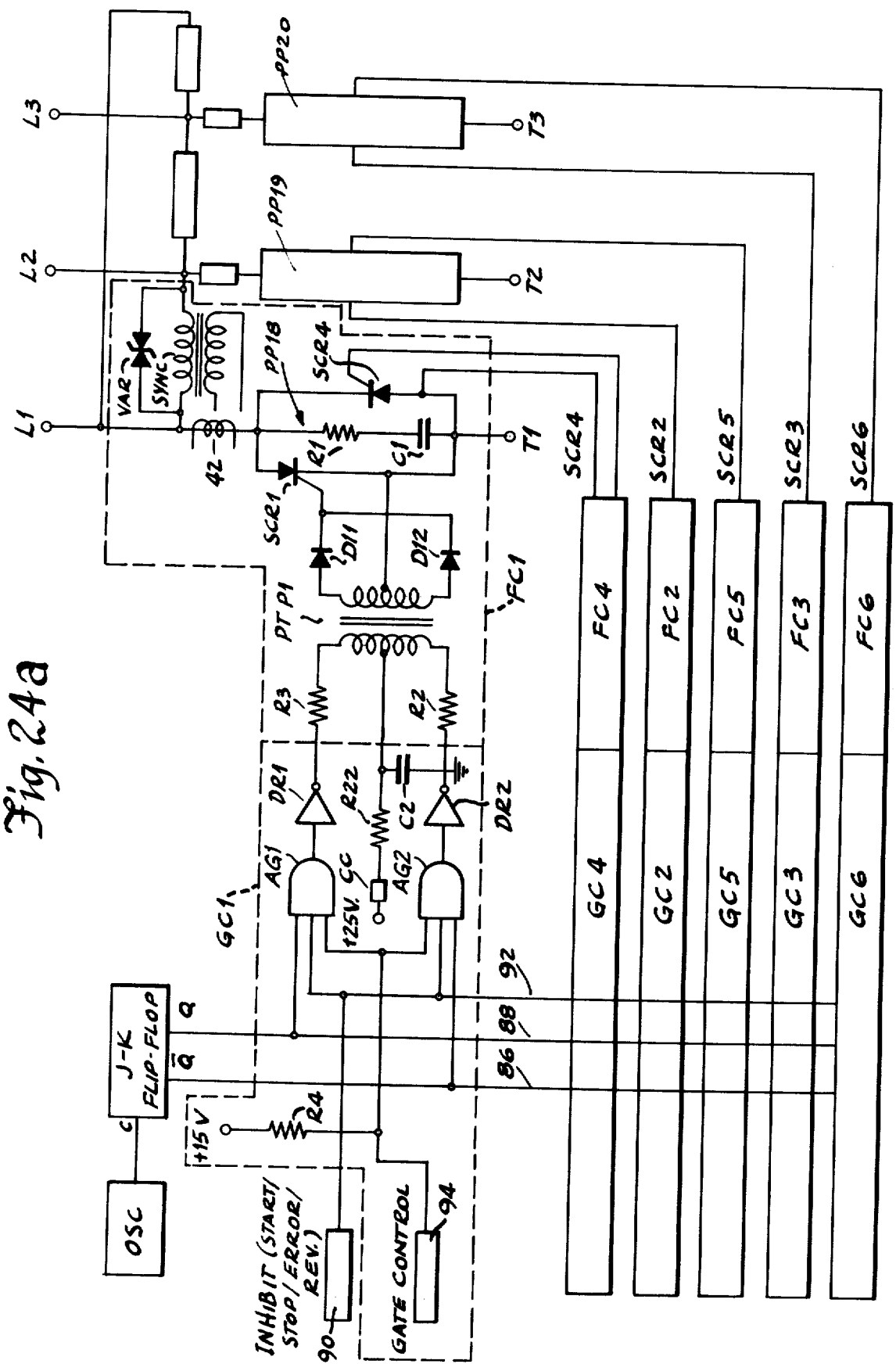
FIG. 24a is a circuit diagram of a universal start/stop gate control circuit, portions of which are on printed circuit boards that are mounted on the respective power poles as shown in FIGS. 4a–c and 7a–c.
Figure 24B:
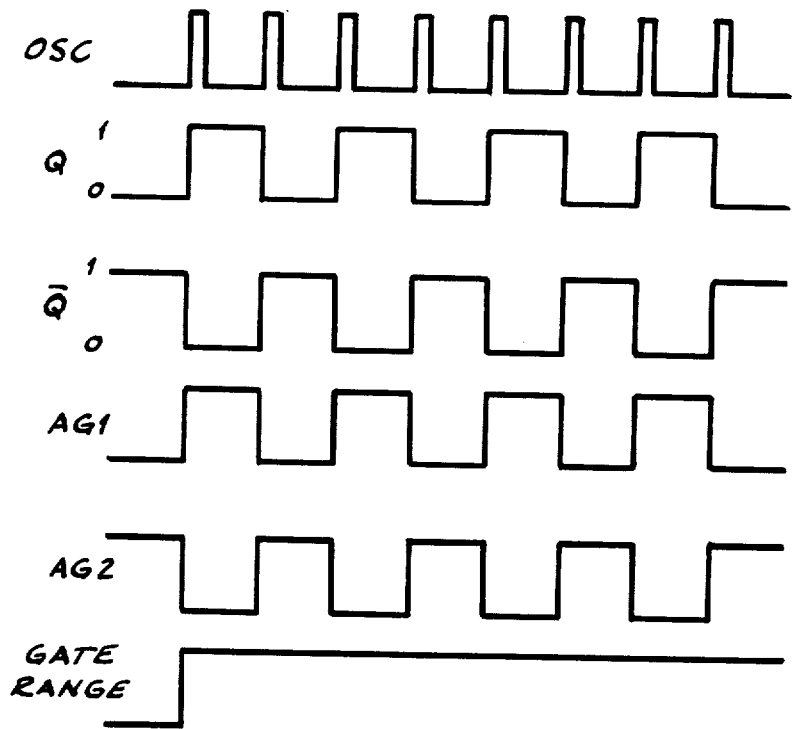

FIGS. 24a–b show a circuit diagram and operating curves for a universal gate control circuit for SCR power poles of the type hereinbefore described. In FIG. 24a, power pole PP18 is shown in detail while power poles PP19 and PP20 which are similar thereto are shown schematically. Also, the gate control circuit for SCR1 of power pole PP18 is shown in detail while the gate control circuit for SCR4 thereof and the gate control circuits for the pairs of SCR's of power poles PP19 and PP20 which are similar are shown schematically. For illustrative purposes, each of these power poles in FIG. 24a is of the 2-terminal type shown in FIGS. 1a–b having two SCR's in reverse-parallel connection between a line terminal L1, L2, L3 and and load terminal T1, T2, T3.

The circuit elements shown in FIG. 24a that are individual to each power pole are mounted on that power pole subassembly. Current transformer 42 of FIG. 24a which uses line L1 as the primary and has a secondary coil is also shown in FIGS. 4b and 7b wherein the conductive bushing between bus connector 34 and line terminal 38 is the primary and coil 42 surrounding this bushing is the secondary of the current transformer.

Firing PC (printed circuit) board 44 that is mounted on the base of the power pole as shown in FIGS. 4b and 7b supports and connects the firing circuit FC1 elements enclosed in broken lines in FIG. 24a. This includes synchronizing transformer SYNC and varistor VAR connected across its primary winding that are connected between power lines L1 and L2. Such synchronizing transformers synchronize the firing of the SCR gates with their positive anode-to-cathode voltage periods. These PC board elements also include resistor R1 and capacitor C1 connected in series across the two reverse-parallel SCR's of the power pole. This RC circuit prevents inadvertent firing of the SCR's by slowing down the rate of change of voltage thereacross. These PC board elements also include input resistors R2 and R3, pulse transformer PTP1 and diodes D11 and D12 that control SCR1 as well as the corresponding elements in firing circuit FC4 that controls SCR4 in this power pole. Firing circuits FC2 and FC5 have similar circuit elements for controlling SCR2 and SCR5 in power pole PP19 and firing circuits FC3 and FC6 have similar circuit elements for controlling SCR3 and SCR6 in power pole PP20.

The gate control circuit shown in FIG. 24a is constructed so that it has universal application for controlling the gates of the SCR's in the various power control circuit configurations hereinbefore described. The portion GC1 of this gate control circuit that controls SCR1 is shown diagrammatically but portion GC4 thereof which controls SCR4 and is similar is shown in block form, as are portions GC2, GC5 and GC3, GC6 which control the pairs of SCR's in power poles PP19 and PP20 since they too are similar.

This gate control circuit shown at the left-hand portion of FIG. 24a is provided with an oscillator OSC that provides a succession of sharp pulses as shown by the upper curve marked OSC in FIG. 24b. The oscillator pulses are applied to the clock input C of a J-K flip-flop of the 4027 type or the like. This flip-flop is arranged (connecting its J and K inputs to positive voltage and its S and R inputs to ground) so that successive clock pulses will provide alternate "1" (high) and "0" (low) outputs at outputs Q and $\overline{Q}$ as shown by the second and third curves marked Q and $\overline{Q}$ in FIG. 24b. As shown therein, the positive-going level change of each clock pulse OSC will cause one of the outputs to go to "1" and the other output to go to "0" and to alternate with successive clock pulses. These flip-flop output pulses are applied to first inputs of AND gates AG1 and AG2 in gate control circuit GC1 for SCR1.

These J-K flip-flops are also multiplied to the other five gate control circuits GC2-GC6 as shown by conductors 86 and 88 in FIG. 24a.

AND gates AG1 and AG2 are three-input types. Second inputs of these AND gates receive an inhibit signal from control signal circuit 90 which inhibit signal may be a start-stop signal, an error signal, a reversing signal, or the like, depending upon the configuration of and use to which the power poles circuit is being put. This inhibit signal is also applied to the other gate control circuits in a predetermined manner as schematically indicated by conductor 92 as shown in FIG. 24a. Third inputs of AND gates AG1 and AG2 receive a gate control signal from gate signal circuit 94 which is individual to gate control circuit GC1. The other gate control circuits GC2-GC6 have their own gate signal circuits because the SCR's are fired at different times and in various sequences depending upon the configuration of and use to which the power poles group is being applied. Gate signal circuit 94 is connected through a resistor R4 to a positive voltage supply of 15 volts or the like so that a "0" input signal thereat is "not gate" and a "1" signal is "gate".

The signals coming from the current transformers such as 42 and the synchronizing transformers such as SYNC are used in control signal circuit 90 and gate signal circuits 94 to control the operation thereof.

AND gates AG1 and AG2 provide output signals affording a continuous gating range as shown by the lowest curve in FIG. 24b marked GATE RANGE. For this purpose, it will be seen that whenever output Q of the J-K flip-flop goes to "1" as shown by the corresponding curve in FIG. 24b, and is applied to the first input of ANd gate AG1 and assuming that the second and third inputs of this AND gate also have "1" signals coming thereto, its output goes to "1" as shown by curve AG1 in FIG. 24b. On the next oscillator pulse, output $\bar{Q}$ of the J-K flip-flop goes to "1" while output Q goes to "0", causing the output of AND gate AG2 to go to "1" as shown by curve AG2 in FIG. 24b while the output of AND gate AG1 goes to "0". And these outputs of the AND gates AG1 and AG2 repeat as shown in FIG. 24b. These outputs of the AND gates are applied through inverting drivers DR1 and DR2 and resistors R3 and R2 to opposite sides of a pulse transformer PTP1 primary winding, respectively, the center tap of this primary winding being connected through a resistor R22 and a control circuit CC to a positive D.C. source and also through a capacitor C2 to ground. The opposite ends of the pulse transformer secondary winding are connected through diodes D11 and D12, respectively, to the gate of SCR1 while the center tap of this secondary winding is connected to the cathode of SCR1.

In this manner of gate control, it will be seen that the SCR's of the power poles can be fired into conduction in any manner and sequence desired according to signals applied to the AND gates from circuits 90 and 94, all the way from continuous on to very short periods of conduction in the desired sequence depending upon the particular power control application of the power pole thyristors.

While the apparatus hereinbefore described is effectively adapted to fulfill the objects stated, it is to be understood that the invention is not intended to be confined to the particular preferred embodiment of solid state motor control universal assembly means and method disclosed, inasmuch as it is susceptible of various modifications without departing from the scope of the appended claims.

We claim:

1. Solid state power pole universal assembly means comprising:
    a pair of semiconductors of the type having flat opposite faces serving as power terminals separated by lateral sides adapting them for pressure mounting at said faces and being arranged in spaced apart side-by-side relation in reversed directions so that different power terminals face in the same direction;
    first mounting and connecting means comprising a first long bus bar against the faces of both said semiconductors that face in the same direction and having a terminal end extending in a first lateral direction;
    second mounting and connecting means comprising a selected one of two interchangeable bus bar means including (a) bus bar means having a second long bus bar like the aforesaid first long bus bar against the faces of both said semiconductors that face in the other direction and having a like terminal end extending in the opposite lateral direction, and (b) bus bar means having two like short bus bars against the faces of respective semiconductors that face in the other direction and having like terminal ends extending in said first and said opposite lateral directions;
    a long heat sink engaging said first long bus bar and heat sink means engaging the selected bus bar means of said second mounting and connecting means;
    a pair of clamps extending through said heat sink and said first long bus bar and said bus bar means of said second mounting and connecting means and said heat sink means for clamping the respective semiconductors therebetween to provide a power pole sub-unit;
    and supporting and electrical connecting means attached to said bus bar terminals for mounting and insulating said power pole sub-unit on a panel and affording connection thereof along or in combination with other like power pole sub-units in a power control system.

2. A universal method of making either a two-terminal solid state power pole having a pair of semiconductors in reverse-parallel connection between a first terminal and a second terminal or a three-terminal solid state power pole having a pair of semiconductors in series connection between first and second terminals with a third terminal therebetween for use alone or in combination with other like power poles in a large variety of electric power control systems comprising:
    providing a common group of elements for assembling either said two-terminal power pole or said three-terminal power pole, said elements comprising:
    two semiconductors having opposite power terminal faces;
    two like long bus bars having a terminal at one end;
    two like short bus bars having a terminal at one end;

a long heat sink;
two short heat sinks;
and two clamps;
selecting said two long bus bars for a two-terminal power pole and arranging their terminals in opposite directions or selecting one of said long bus bars and said two short bus bars for a three-terminal power pole and arranging the terminals of said long bus bar and one of said short bus bars in one direction and the terminal of the other short bus bar in the other direction;
and clamping said semiconductors in spaced apart and reversed relation with respect to their power terminal faces so that each semiconductor is clamped between two of the selected bus bars and two of said heat sinks to provide a good electrical connection between said semiconductors and said selected bus bars, respectively, as well as a good heat conducting connection to said heat sinks;
and supporting said power pole by the terminals of said selected bus bars on a mounting panel.

3. A solid state power pole universal assembly structure comprising:
a pair of semiconductor elements having opposite power terminal faces affording pressure mounting thereof and being arranged in spaced apart side-by-side relation in reversed directions so that different power terminal faces of the respective elements are in one plane and the other power terminal faces thereof are in another plane;
first mounting and connecting means comprising a first bus bar against the power terminal faces of both said semi-conductor elements in said one plane and having a terminal portion extending in a first lateral direction;
second mounting and connecting means comprising a selected one of two interchangeable bus bar means including (a) a second bus bar against the power terminal faces of both said semiconductor elements in said other plane and having a terminal portion extending in the opposite lateral direction, and (b) two bus bars against the power terminal faces of the respective semiconductor elements in said other plane and having terminal portions extending in said first and said opposite lateral directions;
a first heat sink against said first bus bar and a pair of heat sinks opposite the respective semiconductor elements and against the selected bus bar means of said second mounting and connecting means;
a pair of clamps extending through said first heat sink and said first bus bar and said selected bus bar means of said second mounting and connecting means and also through said pair of heat sinks, respectively, for clamping the respective semiconductor elements therebetween to provide a power pole sub-unit;
and means supporting and electrically connecting said power pole sub-unit at said terminal portions in a power control system.

4. The solid state power pole universal assembly structure claimed in claim 3, wherein:
said first bus bar is an elongated flat member;
and said second bus bar is like said first bus bar.

5. The solid state power pole universal assembly structure claimed in claim 3, wherein:
said first bus bar is a long bus bar in the form of an elongated flat metal ribbon member and said terminal portion thereof comprises a transverse slot extending from one edge thereof;
and said second bus bar is like said first bus bar but turned so that the slots at said terminal portions thereof are positioned in the same direction.

6. The solid state power pole universal assembly structure claimed in claim 3, wherein:
said two bus bars of said second mounting and connecting means are short bus bars in the form of like elongated flat metal ribbon members, and said terminal portion of each thereof comprises a transverse slot extending from one edge thereof, and one of said two bus bars is turned so that the slots thereof are positioned in the same direction.

7. The solid state power pole universal assembly structure claimed in claim 3, wherein said means supporting and electrically connecting said power pole sub-unit at said terminal portions comprises:
a panel;
and means mounting said power pole sub-unit on said panel and affording electrical connection thereof in a power control system as well as providing means insulating said power pole from said panel.

8. The solid state power pole universal assembly structure claimed in claim 7, together with:
at least one additional like solid state power pole mounted on said panel with the first mentioned power pole;
a first bus extending beneath said supporting and insulating means connecting the terminals of corresponding first short bus bars of said power poles;
and a second bus extending beneath said supporting and insulating means connecting the terminals of corresponding second short bus bars of said power poles.

9. The solid state power pole universal assembly structure claimed in claim 7, wherein:
said semiconductor elements are controllable thyristors having gate and cathode terminals in addition to their power terminal faces;
and a firing circuit mounted on said supporting and insulating means connected to said gate and cathode terminals.

10. The solid state power pole universal assembly structure claimed in claim 7, together with:
a plurality of additional like solid state power poles mounted on said panel in side-by-side relation with the first mentioned power pole;
said semiconductors of said power poles comprise controlled semiconductors;
and a universal gate control circuit for said controlled thyristors comprising:
an oscillator;
a flip-flop driven by said oscillator and having two outputs alternating "1" and "0";
a pair of logic gates for each said thyristor connected to the respective outputs of said flip-flop;
means applying the outputs of said pairs of logic gates to the respective thyristors to afford a maximum of continuous firing of said thyristors;
inhibit signal circuit means for controlling said logic gates;
and gate control circuit means for controlling said logic gates to control the firing of said thyristors.

11. The combination of:
a supporting frame;
a pair of semiconductor elements;

a three-part heat sink comprising one long heat sink common to both said semiconductor elements and two short heat sinks individual to said semiconductor elements;

a two-terminal bus bar arrangement comprising two long bus bars common to both said semiconductor elements and having terminals arranged in opposite directions;

a three-terminal bus bar arrangement comprising one long bus bar common to both said semiconductor elements and two short bus bars individual to said semiconductor elements, and each said bus bar having a terminal at one end with two of said terminals extending in one direction and the third terminal extending in the other direction;

means for interchangeably clamping either of said bus for arrangements between said semiconductor elements and said heat sinks whereby power poles may be assembled having different characteristics such that said semiconductor elements are electrically connected in reverse-parallel between the terminals of said two-terminal bus bar arrangement and said semiconductor elements are electrically connected in series between two terminals of said three-terminal bus bar arrangement with the third terminal between said semiconductor elements.

and means for mounting a desired number of said power poles on said supporting frame and connecting the same in an electrical control system.

12. A method of making solid state electric power poles having a pair of semi-conductor elements connected between terminals thereof for use alone or in combination with other power poles in a large variety of electric power control systems comprising the steps:

providing a group of parts for assembling power poles comprising:

a plurality of semiconductor elements having opposite power terminal faces;

a plurality of long bus bars having a terminal at one end and being long enough to span a pair of said semiconductor elements;

a plurality of short bus bars having a terminal at one end and having a length to span one of said semiconductor elements;

a plurality of long heat sinks long enough to span a pair of said semiconductor elements;

a plurality of short heat sinks having a length to span one of said semiconductor elements;

and a plurality of clamps;

selecting two of said long bus bars for a two terminal power pole and arranging their terminals in opposite directions;

selecting one of said long bus bars and two of said short bus bars for a three-terminal power pole and arranging the terminals of said long bus bar and one of said short bus bars in one direction and the terminal of the other short bus bar in the other direction;

then arranging said parts and clamping pairs of said semiconductor elements with respective pairs of said clamps such that the semiconductor elements of each pair thereof are in spaced apart and reversed relation with respect to their power terminal faces and a pair of semiconductor elements is clamped between said two selected long bus bars with said long heat sink against one of said selected long bus bars and two of said short heat sinks against the other selected long bus bar opposite the respective semiconductor elements for a two-terminal power pole; and for a three-terminal power pole a pair of semiconductor elements is clamped between said selected one long bus bar and two short bus bars with said long heat sink against said long bus bar and two of said short heat sinks against said selected two short bus bars opposite the respective semiconductor elements;

and supporting said power poles by said terminals of said bus bars on mounting panel means.

* * * * *